(12) United States Patent
Ishii et al.

(10) Patent No.: US 6,677,572 B2
(45) Date of Patent: Jan. 13, 2004

(54) OPTICAL MODULE

(75) Inventors: Sonomi Ishii, Tokyo (JP); Takehiko Nomura, Tokyo (JP); Masayuki Iwase, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 77 days.

(21) Appl. No.: 09/879,861

(22) Filed: Jun. 11, 2001

(65) Prior Publication Data

US 2002/0047088 A1 Apr. 25, 2002

Related U.S. Application Data (63) Continuation of application No. PCT/JP00/07065, filed on Oct. 12, 2000.

(30) Foreign Application Priority Data

Oct. 12, 1999 (JP) .............................. 11-290130
Aug. 22, 2000 (JP) .......................... 2000-251301

(51) Int. Cl.[7] .......................... H01L 27/00; H01L 31/12
(52) U.S. Cl. ...................... 250/214.1; 250/551; 257/80
(58) Field of Search ................ 250/239, 214.1, 250/551, 216; 257/80–84, 431–435

(56) References Cited

U.S. PATENT DOCUMENTS

| | | | | |
|---|---|---|---|---|
| 3,842,263 A | * | 10/1974 | Kornrumpf et al. | ......... 250/239 |
| 4,237,382 A | * | 12/1980 | Thillays | ...................... 250/551 |
| 4,695,858 A | * | 9/1987 | Takezawa et al. | ............. 357/19 |
| 5,059,809 A | * | 10/1991 | Fukuyama | ................... 250/551 |
| 5,291,038 A | * | 3/1994 | Hanamoto et al. | ............. 257/82 |
| 5,436,472 A | * | 7/1995 | Ogawa | ......................... 257/82 |
| 6,399,934 B1 | * | 6/2002 | Sullivan et al. | ......... 250/214 R |

\* cited by examiner

*Primary Examiner*—Stephone B. Allen
(74) *Attorney, Agent, or Firm*—Knobbe, Martens, Olson & Bear LLP (57) ABSTRACT

An optical module comprises a photodetector and a light emitting device arranged at a narrow pitch on an Si substrate wherein high receiving sensitivity of the photodetector is realized, and the optical module suppresses the influences of electromagnetic fields on the photodetector, which are generated by the light emitting device. A conductor wall is provided between the photodetector and the light emitting device arranged on the Si substrate.

16 Claims, 13 Drawing Sheets

OPTICAL MODULE

This application is a continuation and claims priority under 35 U.S.C. Section 120 to International Application No. PCT/JP00/07065, filed on Oct. 12, 2000. The disclosure of this application is hereby incorporated by reference in its entirety. The International Application was published as Publication No. WO 01/28004 A1 in the Japanese language on Apr. 19, 2001.

TECHNICAL FIELD

The present invention relates to an optical module having a substrate on which a light emitting device and a photodetector are mounted.

BACKGROUND ART

For example, in an optical transmission system with the function of bidirectional transmission, a bidirectional optical transmission module with a light emitting device and a photodetector incorporated inside is used. According to recent developments in computer hardware and networks, a reduction in the size and cost of bidirectional optical transmission modules has been demanded since the module has come to be installed domestically.

A method for reduction in size and cost, wherein a part is incorporated into a package and connected to optical fibers for transmission and/or waveguide parts, is suitable in terms of the manufacturing and assembling processes. The part comprises a substrate with conductor inter connections laid as necessary, wherein a light emitting device and a photodetector are mounted on the substrate.

In this case, an Si substrate is preferable as the substrate to be provided with a light emitting device and a photodetector. It is possible to acquire a Si material with stable quality at a low price, and the Si material has excellent in workability, so that formation of alignment marks for positioning a light emitting device and a photodetector when mounting them, and formation of V-grooves for positioning optical fibers are easy.

In the present specification, an Si substrate to be used for such a purpose, or an Si substrate which has a light emitting device and a photodetector and conductor inter connection provided on it with alignment marks and V-grooves for positioning formed as necessary, is called an SOB (Silicon Optical Bench).

Figure 1:
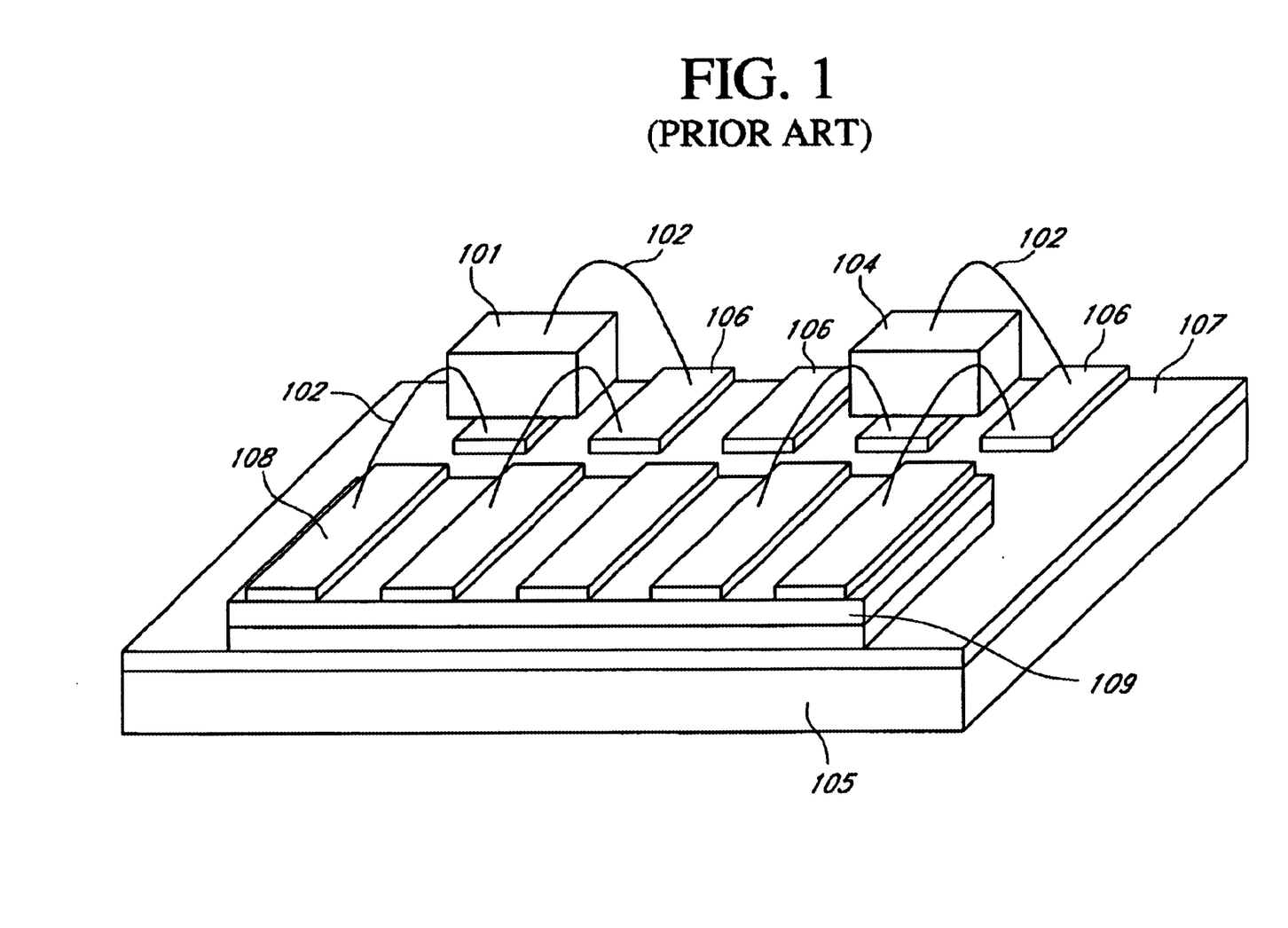
FIG. 1 is a conception diagram of a conventional SOB.

FIG. 1 shows a conception diagram of the SOB. In FIG. 1, the reference numeral 105 denotes a substrate with a thickness of, for example, 1 mm, on which conductor (inter connection) patterns 106 are formed via insulation layer 107 made from $SiO_2$ or the like.

Light emitting device 104 and photodetector 101 are mounted on the substrate 105, and connected to the conductor patterns 106 on the substrate 105 by soldering and bonding wires 102. Furthermore, the reference-numeral 108 denotes a leader inter connection conductor, and the reference numeral 109 denotes a dielectric.

Figure 2:
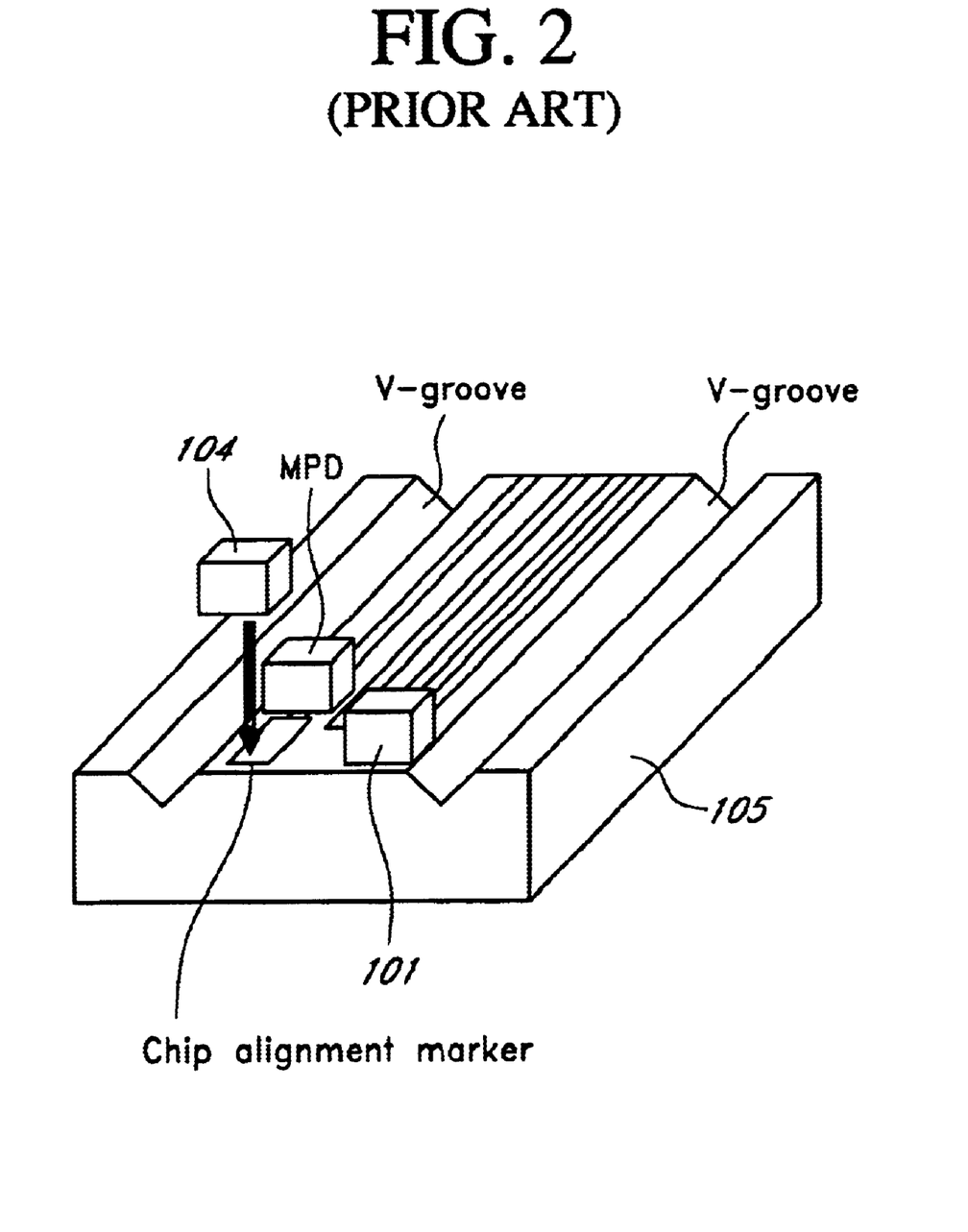
FIG. 2 is a conceptual diagram of the same conventional SOB.

FIG. 2 is a drawing showing the entire construction of the SOB. In this figure, in addition to the light emitting device (LD) 104 and the photodetector (PO) 101, a photodetector (MPD) for detecting and controlling the output of the light emitting device 104 is disposed at the rear stage of the light emitting device 104. On the substrate 105, an alignment mark is formed for positioning and mounting the light emitting device 104 and photodetector 101, along with V-grooves to be used for positioning and connecting the SOB to external optical fibers (ferrules) and waveguides.

Figure 3:
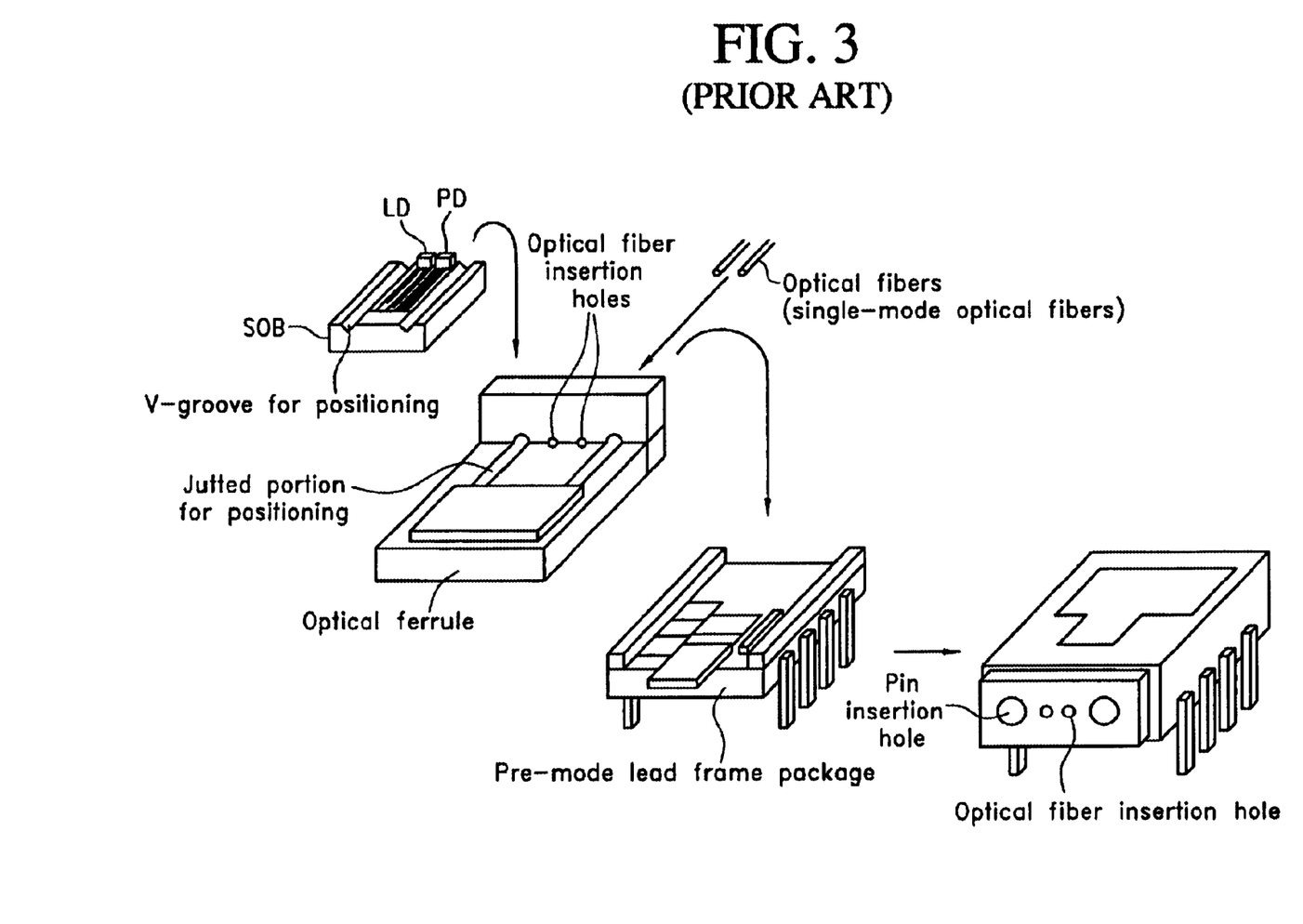
FIG. 3 is an entire view of a general SOB.

The SOB thus constructed is packaged together with a connection structure for connection with external optical fibers, for preamplifiers, external connection terminals, or optical ferrules, for example, and is thus completed as an optical module (see FIG. 3).

For realizing reduction in the size of the optical module, it is preferable that the size of the substrate on which the light emitting device and the photodetector are mounted is reduced. For example, the current standard pitch of an optical fiber ribbon is 250 $\mu$m, and if connection with the optical fiber ribbon is set as a precondition, the application of the module in which the light emitting device and the photodetector are arranged at a 250 $\mu$m pitch is most ideal.

Furthermore, the light emitting device is generally driven by a current of 10 mA or more, however, a photocurrent generated from the photodetector is smaller by several digits than the drive current, which is normally in the order of $\mu$A at most. Particularly, in optical transmission, since it is demanded that the relay stations be reduced and transmission be made with more receiving stations, it is important to increase the photosensitivity of the photodetector. For example, in a certain standard, a minimum receiving sensitivity of −30 dBm (0.001 mW) or less is required for an application of several-hundred Mb/s, and also, some cases require detection of a photocurrent of $\mu$A or less.

In examination of reducing the size of a module and photodetector's detection of a small photocurrent, an important factor in the development of an application, in which the light emitting device and photodetector are mounted on an Si substrate, is to solve the problem of electric crosstalk generated by signals of the light emitting device side influencing the photodetector side. The present invention provides an optical module wherein the size thereof is reduced and the problem of crosstalk is solved.

DISCLOSURE OF THE INVENTION

The present invention provides an optical module having the following construction. That is, the optical module of the invention has a substrate which has a photodetecor and a light emitting device mounted on it and is provided with a conductor wall between the photodetector and the light emitting device. The conductor wall is fitted and fixed, a necessary, into a groove portion formed in the substrate.

In a more preferable embodiment, the conductor wall is provided with a top plate positioned above one or both of the photodetector and the light emitting device. The conductor wall may be formed so as to have a T-shaped section or an L-shaped section. As another embodiment, the conductor wall may be composed of a first portion formed to have an L-shaped section as mentioned above and a second portion forming a top plate which has a bar-shaped section and is provided independently from said first portion.

In one embodiment, the conductor wall is connected to at least one of a ground provided in a drive circuit of the light emitting device and a ground provided in an amplifier circuit for electric signals outputted from the photodetector. In this case, the conductor wall may be formed of a plurality of conductors which are independent and separate from each other, and the grounds of each conductor may be separately provided.

In another embodiment, the conductor wall of the invention may be formed by forming a conductive film on the surface of a wall member made of a resin mold.

Electric crosstalk is considered to occur between the photodetectors and light emitting device themselves, the substrate, inter connection patterns, and bonding wires or the like its mechanism is complicated. However, as in the abovementioned construction, electric crosstalk from the light emitting device can be effectively suppressed by forming the conductor wall between the photodetector and the light emitting device.

The present invention solves the problem of electric crosstalk from signals of the light emitting device side, which harmfully influences the photodetector side, by a simple construction in which a conductor wall is formed between the photodetector and the light emitting device. The optical module of the invention is excellent for practical use since an effect of remarkably reduced crosstalk can be obtained by a means without disadvantages such as significant increases in the material cost, the number of processes, the substrate's size, and substantial deterioration in the characteristics of the optical module.

The invention is to be applied to an optical module, and is useful for an optical module in which −20 dBm is required as the minimum photosensitivity of said photodetector, a normal drive current of said light emitting device is 10 mA or more. The photodetector and the light emitting device which are in the most proximity to each other are disposed at a pitch of 1 mm or less (pitch is the distance between the centers of the light emitting device and photodetector).

In short, the present invention aims to effectively suppress crosstalk from the light emitting device to the photodetector by employing a means which can be easily employed industrially without complicated processing, an increase in the material cost, and harmful influences on the characteristics of the optical module. The invention is useful in various industrial fields for manufacturing and using optical modules having substrates on which light emitting devices and photodetectors are mounted.

Particularly, in the invention, the conductor wall is provided with a top plate to cover the photodetector, whereby the electromagnetic shield effect can be increased. A construction is employed in which the conductor wall is further provided with a top plate to cover the light emitting device, whereby the electromagnetic effect can be further increased.

Moreover, the conductor wall having the top plates is constructed so as to have a T-shaped section or an L-shaped section, or is composed of a first portion formed to have an L-shaped section and the second portion formed to have a bar-shaped section and provided independently from said first portion. The provision of the conductor thus constructed allows the optical module having the abovementioned excellent effect to be easily formed.

Furthermore, in the invention, the optical module is an optical part having at least a photodetector and a light emitting device on one side surface, and substantially consists of an Si substrate as a main body which has the photodetector and the light emitting device mounted on it. In addition, in the invention, the optical module is an optical part including a substrate as one component which has the photodetector and the light emitting device mounted on it, that is, an optical part including, as other components, an optical connection mechanism such as an MT-RJ connector and a ferrule for connecting the photodetector and light emitting device to optical fibers or waveguides, and/or inter connection and terminals for detecting and amplifying the photocurrent of the photodetector and applying and detecting the drive voltage of the light emitting device, and/or a casing, and/or optical fibers.

BRIEF DESCRIPTION OF THE DRAWINGS

FIGS. 4(a)–(b) are explanatory views showing an embodiment of the invention, wherein

FIG. 14 shows still another embodiment of the invention, wherein

BEST MODE FOR CARRYING OUR THE INVENTION

The present invention will be described in detail with reference to the attached drawings.

Figure 4A:
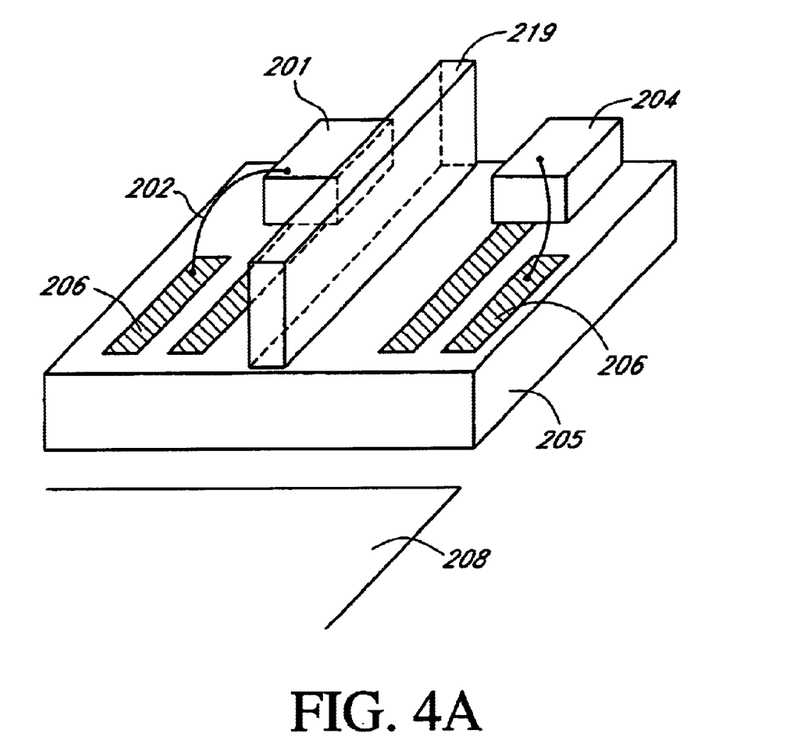
FIG. 4(a) is a drawing showing the main construction.

As shown in FIG. 4(a), conductor wall 219 is mounted between photodetector 201 and light emitting device 204 on Si substrate 205, and shields electromagnetic fields generated by the light emitting device 204.

The material for the conductor wall 219 is not especially limited as long as the material has excellent conductivity. For example, general conductor materials such as copper, aluminum, gold, silver or the like can be used, or alloy conductor materials, and organic or inorganic conductive materials can be used as long as they have excellent conductivity, their shape is easily processed, and they can be mounted on the Si substrate. The conductor wall may have the form of a plate (foil-form) or the form of a mesh (net-form).

Figure 4B:
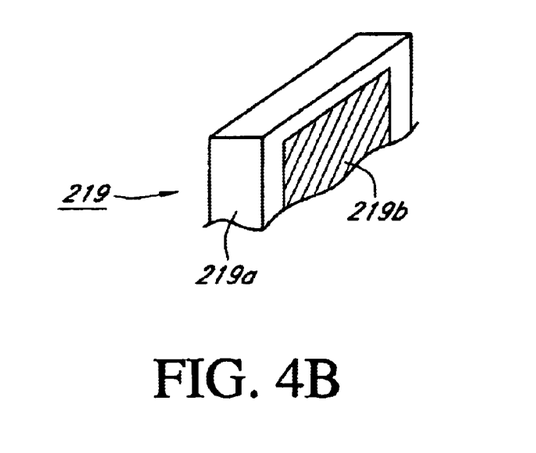
FIG. 4(b) is a drawing showing an example of the conductor wall.

Furthermore, as shown in FIG. 4(b), the conductor wall 219 may have conductive film 219b of Cu, Cu/Ni, or Cu/Ni/Au deposited by means of plating on the surface of wall member 219a made of a hard resin mold. The conductive film 219b can be formed in a desired pattern so that a desirable conduction performance can be obtained and freedom in the module design increased, and therefore, this construction is preferable.

In order to obtain a higher electromagnetic shield effect, it is preferable that the height of the conductor wall 219 is such that it is higher than that of the photodetector 201 or light emitting element 204. In a case where wire bonding 202 is applied on the Si substrate 205 with the photodetector 201 and the light emitting device 204 mounted on it, it is preferable that the height of the conductor wall 219 is made equivalent to or higher than that of the wire bonding 202, and typically, it is preferable that the height of the wall is set to approximately 0.5 mm to 1.5 mm from the surface of the Si substrate 205.

A constant electromagnetic shield effect can be obtained even when the conductor wall 219 is formed only in the proximity of the mounted portion of the photodetector 201 where high photosensitivity is required. However, normally, inter connection patterns 206 and bonding wires 202 for supplying a drive current to the light emitting device 204 and removing a signal current detected by the photodetector 201 are laid on the Si substrate 205. Therefore, in order to prevent crosstalk between the patterns and wires, as shown in FIG. 4(a), it is preferable that the conductor wall 219 is disposed on the Si substrate 205 so as to substantially divide the area in which the photodetector 201, the inter connection pattern 206 for detecting signals received by the photodetector, and the bonding wire 202 are disposed, and the area in which the light emitting device 204, the inter connection pattern 206 for applying a drive voltage to the device, and the bonding wire 202 are disposed.

Furthermore, it is preferable that the conductor wall 219 is installed across the entire length of the Si substrate 205 to completely divide the abovementioned areas on the Si substrate 205.

Figure 5:
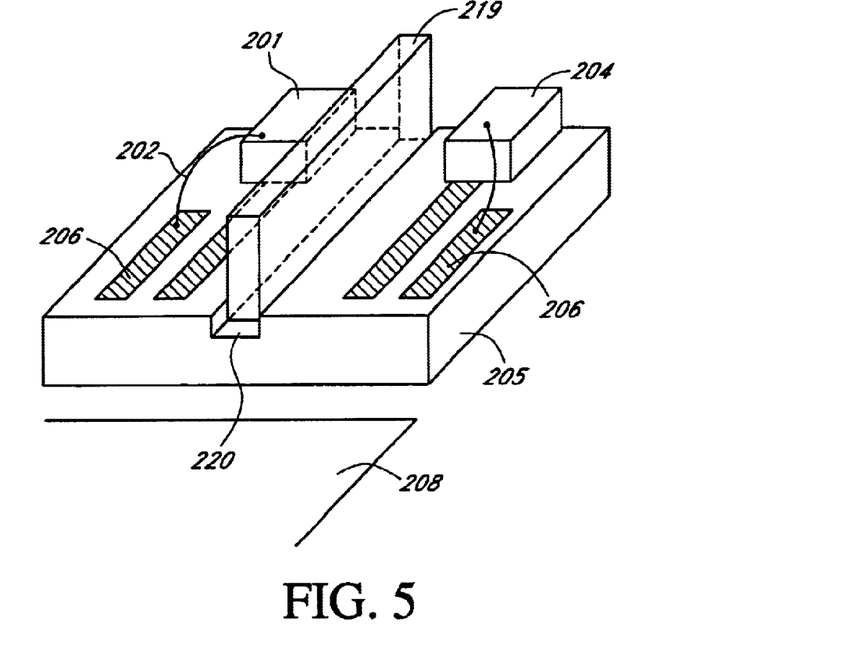
FIG. 5 is an illustration of another embodiment of the invention.

The conductor wall 219 can be installed and fixed by using an adhesive such as an epoxy resin. In one embodiment, as shown in FIG. 5, groove 220 is formed at the position for installation of the conductor wall 219 on the Si substrate 205, and the conductor wall 219 can be fitted and fixed into the groove 220. The groove 220 can be formed by means of a generally-known method, for example, etching or dicing, and the provision of the groove has advantages such as a higher fixing strength and a higher shield effect of the conductor wall 219. Use of an adhesive to secure the fixation is preferable even when the conductor wall 219 is fitted and fixed into the groove 220.

Figure 6:
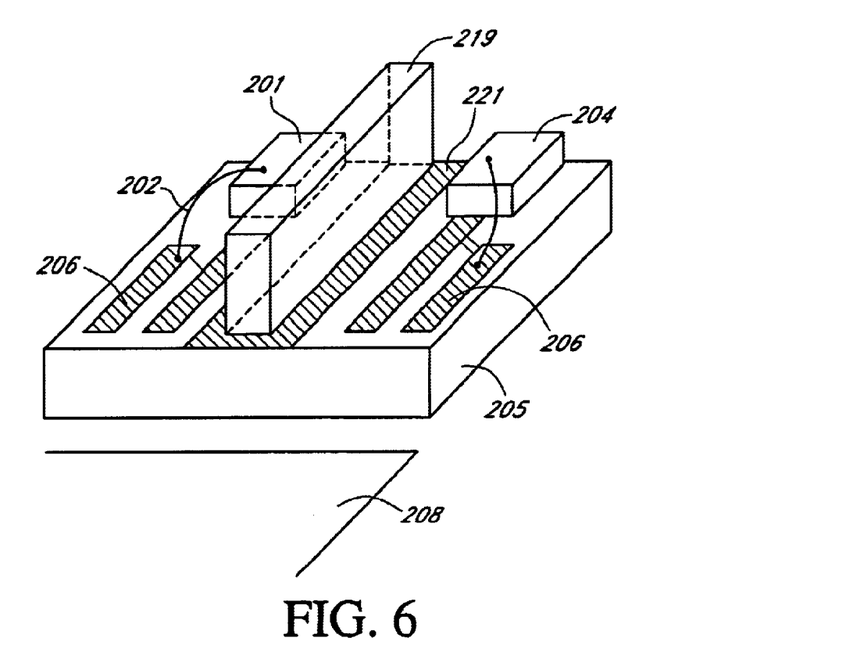
FIG. 6 is an illustration of still another embodiment of the invention.

Moreover, as shown in FIG. 6, it is also possible that conductor pattern 221 is formed on the Si substrate 205, and the conductor wall 219 is installed on this conductor pattern 221. In this case, the conductor pattern 221 can be used as a positioning mark for the conductor wall 219, and any method such as ultrasonic connection or soldering can be employed as a method of fixing the conductor wall 219. Because this conductor pattern 221 functions as a protection trace, the shield effect further increases.

For convenience in the manufacturing process, a construction is employed in which the conductor wall 219 is not directly adhered and fixed on the Si substrate 205, but is fixed to a ferrule, lead frame, or the inner wall of a casing of the optical module. When the Si substrate 205, and the ferrule, lead frame, or casing are installed in the module in the assembly process of the optical module, the conductor wall 219 fixed to the ferrule or the like is disposed between the photodetector 201 and light emitting device 204 on the Si substrate 205. If the space between the photodetector 201 and the light emitting device 204 becomes narrower, fixation of the conductor wall 219 onto the Si substrate 205 becomes difficult. However, this method has an advantage such that installation of the conductor wall 219 can be made easier.

Figure 7:
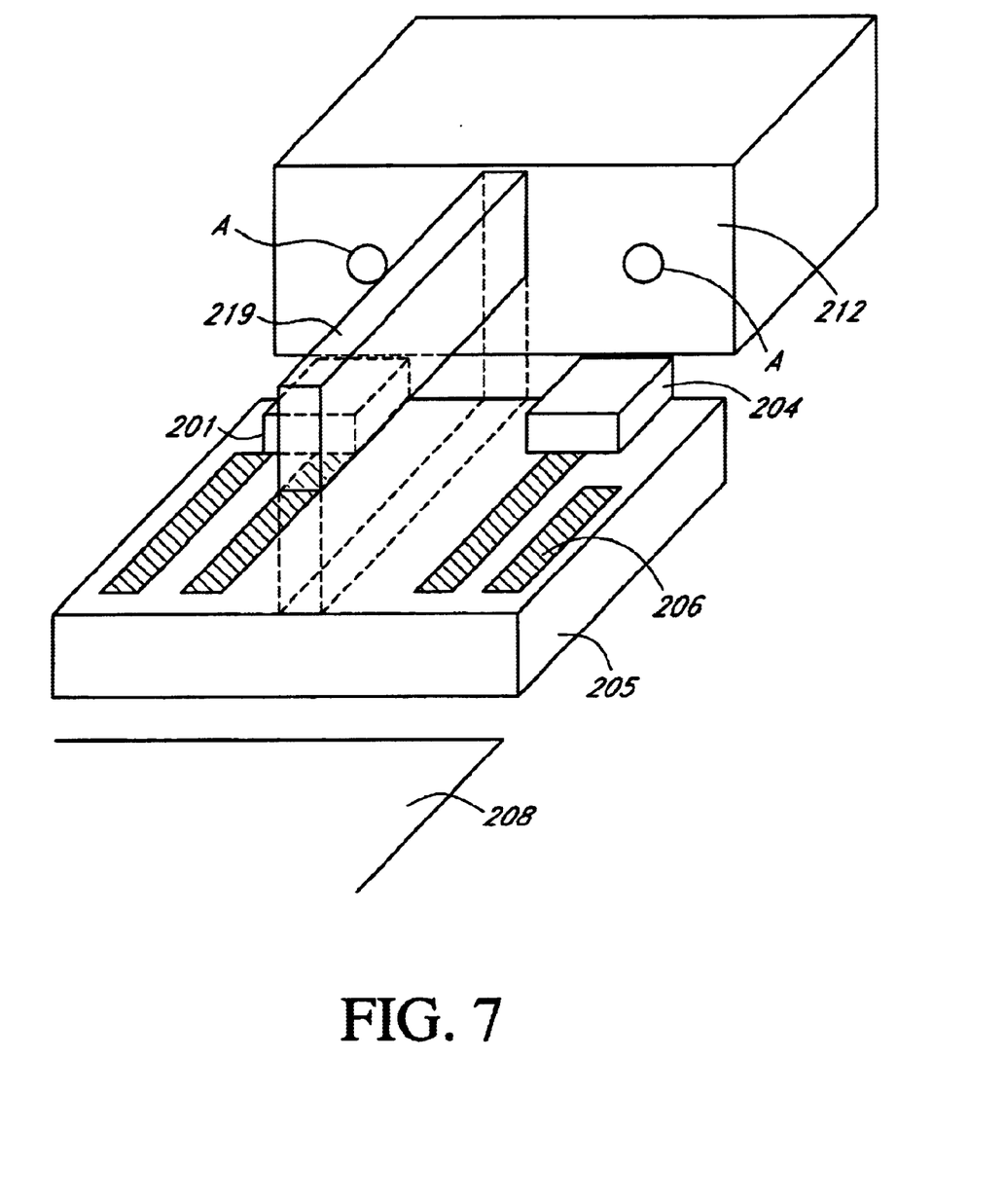
FIG. 7 is an illustration of still another embodiment of the invention.

FIG. 7 shows the positioning relationship between ferrule 212 to which the conductor wall 219 is fixed and Si substrate 205. Since there is a necessity to align optical fibers and the photodetector 201 and light emitting device 204, the Si substrate 205 and the ferrule 212 are to be relatively positioned by using the V-groove, and therefore, a method wherein the conductor wall 219 is attached to the ferrule 212 in advance is especially convenient. Optical fiber insertion holes are identified by the label "A" in the same figure.

Figure 8:
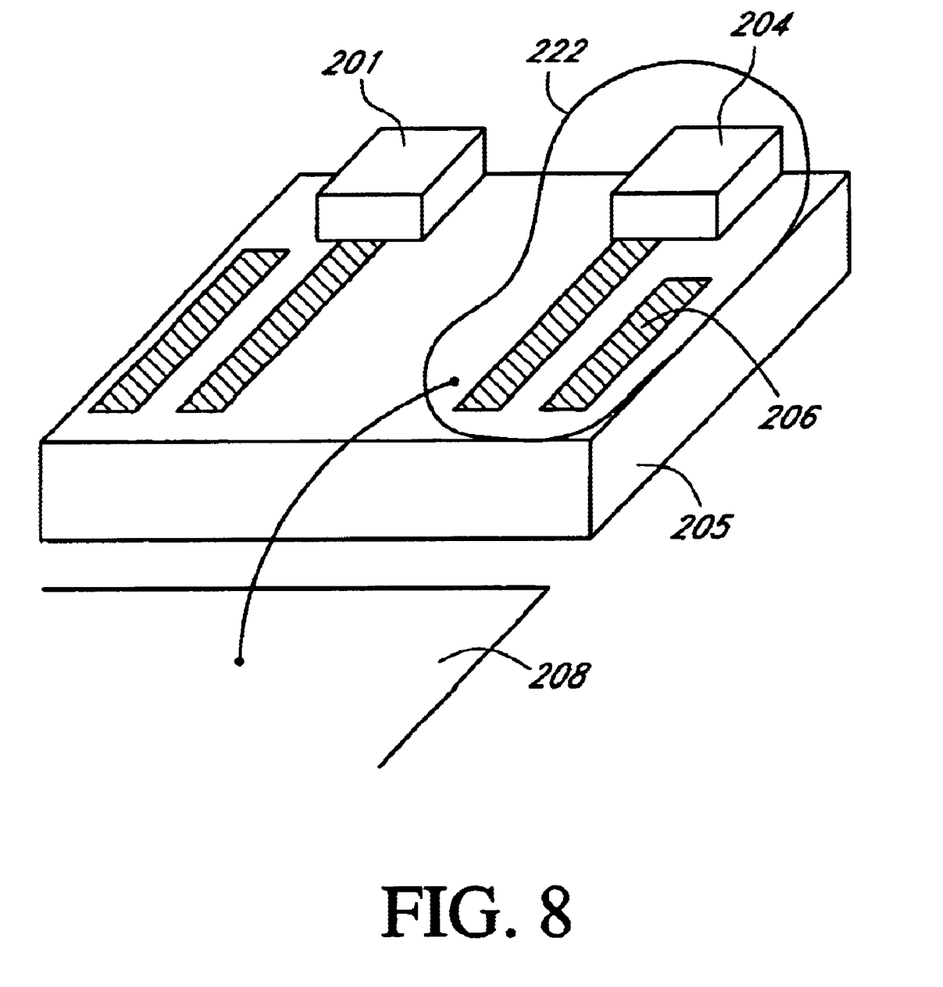
FIG. 8 is an illustration of still another embodiment of the invention.

As illustrated in FIG. 8, it is also possible that the light emitting device 204 is molded by using a resin sealant or the like, and a conductive material layer is formed on the molded surface, whereby the conductor wall 219 is formed. Likewise, it is also possible that the photodetector 201 is molded by using a resin sealant or the like, and the conductor wall consisting of a conductive material layer can be formed on the molded surface. The conductive material layer can be formed by spattering or plating metal or coating a conductive composition (a conductive resin or a conductive coating).

Moreover, in the embodiment shown in FIG. 8, when forming the conductive material layer, masking becomes necessary for the photodetector 201 or the conductor pattern 206 around the light emitting device 204. However, by employing a construction in which the photodetector 201 is molded in the same manner as the light emitting device 204, and a conductive material layer is formed on both of the molded surfaces of the photodetector and the light emitting device, masking may be omitted.

Furthermore, in a case where the conductor wall 219 is grounded and the protection trace (conductor pattern) 221 of FIG. 6 is provided, the electromagnetic shield effect can be further increased by also grounding the protection trace 221.

Figure 9A:
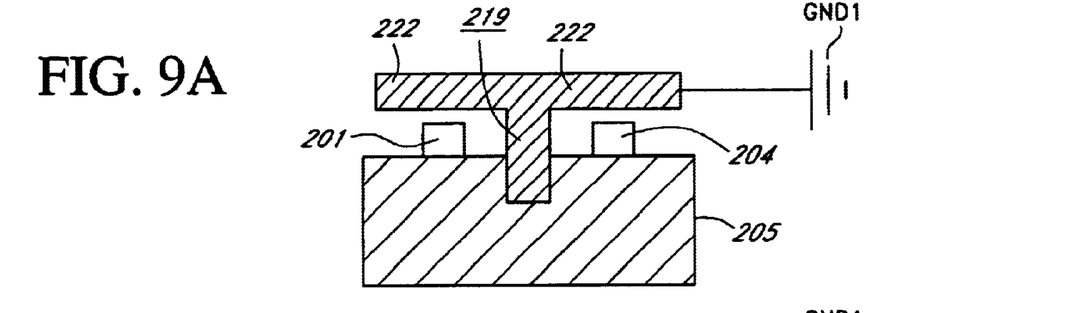
FIG. 9 is an illustration of still another embodiment of the invention.

Moreover, as shown in FIGS. 9(a), (b), (c), and (d), the conductor wall 219 is provided with top plate 222 covering the photodetector 201, whereby the electromagnetic shield effect can be further increased. Furthermore, the conductor wall 219 is provided with top plate 222 to cover the light emitting device 204, whereby the electromagnetic shield effect can be still further increased.

Figure 9B:
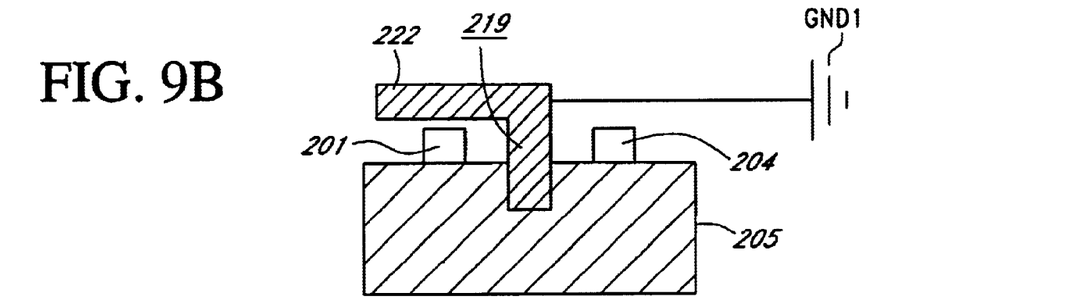
Figure 9C:
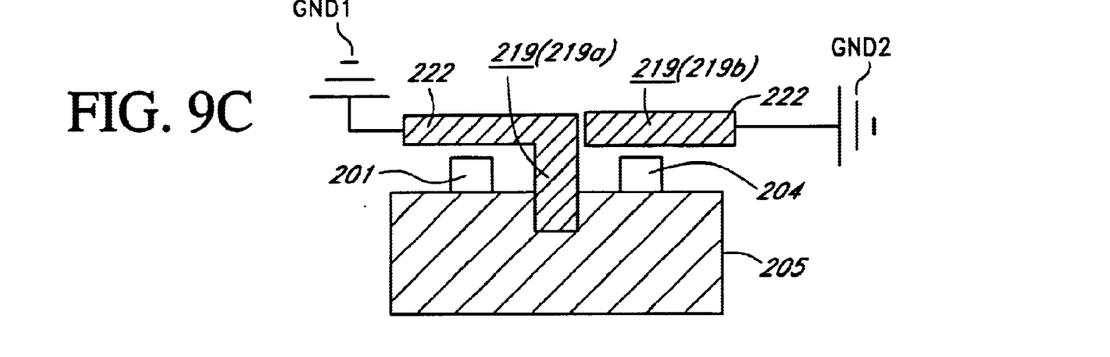
Figure 9D:
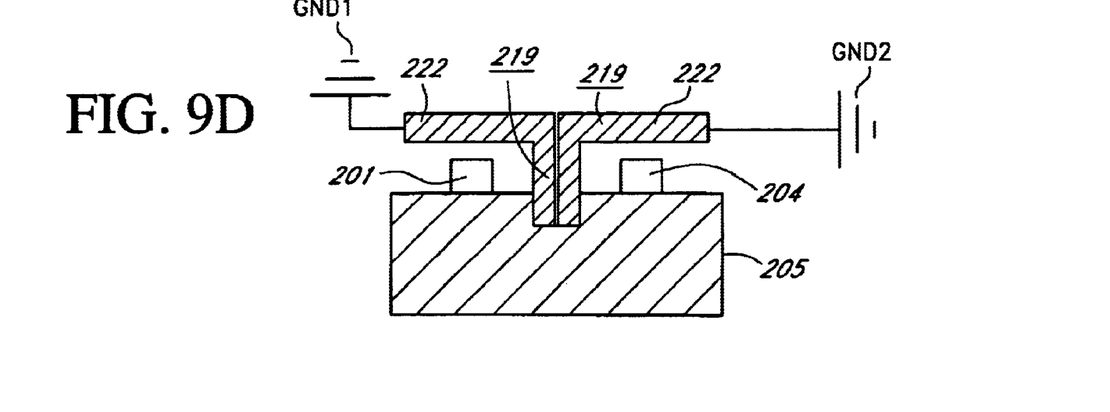

The conductor wall 219 may have a T-shaped section (see FIG. 9(a)) or L-shaped section (see FIG. 9(b)), or may be composed of first portion 219a formed to have an L-shaped section as mentioned above and second portion 219b which is provided independently and separately from said first portion and has a bar-shaped section (see FIG. 9(c)). The conductor wall 219 may be constructed so that two portions with L-shaped sections are formed back to back with each other to cover the photodetector 201 and the light emitting device 204 (see FIG. 9(d)).

The conductor wall having an L-shaped section is easily obtained by bending one plate member. The conductor wall having a T-shaped section is obtained by adhering and fixing two plate members with an electric conductive adhesive or by means of soldering.

The second portion 219b of the form with a bar-shaped section is positioned and fixed by being attached to a casing of the module.

The conductor 219 is connected to at least one of a ground provided in the drive circuit of the light emitting device 204 and a ground provided in the amplification circuit of electric signals outputted from the photodetector. In this construction, additional provision of ground terminals is unnecessary, and the inter connection patterns are short and simple, so that the optical module can be easily reduced in size.

In FIG. 9(c), the ground GND1 of the first portion 219a, which is formed so as to have an L-shaped section of the conductor wall 219 and provided at the photodetector 201 side, is also used as a ground of the amplification circuit of electric signals outputted from the photodetector The ground GND2 of the second portion 219b of the conductor wall 219, which is formed so as to have a bar-shaped section and provided at the light emitting device 204 side, is also used as a ground of the drive circuit of the light emitting device 204.

In the case where the conductor wall 219 is formed of a plurality of portions provided independently and separately from each other, by independently and separately providing grounds for the respective conductor portions 219a and 219b within the SOB, the amount of crosstalk can be reduced, and the inter connection patterns can be constructed to be short and simple.

Furthermore, in FIG. 9(b) and FIG. 9(c), it is also possible to construct the conductor 219 or 219a having an L-shaped section so as to cover the light emitting device 204 side.

Hereinafter, specific, or concrete examples of the invention will be described in reference to the drawings.

CONCRETE EXAMPLE 1

Figure 10:
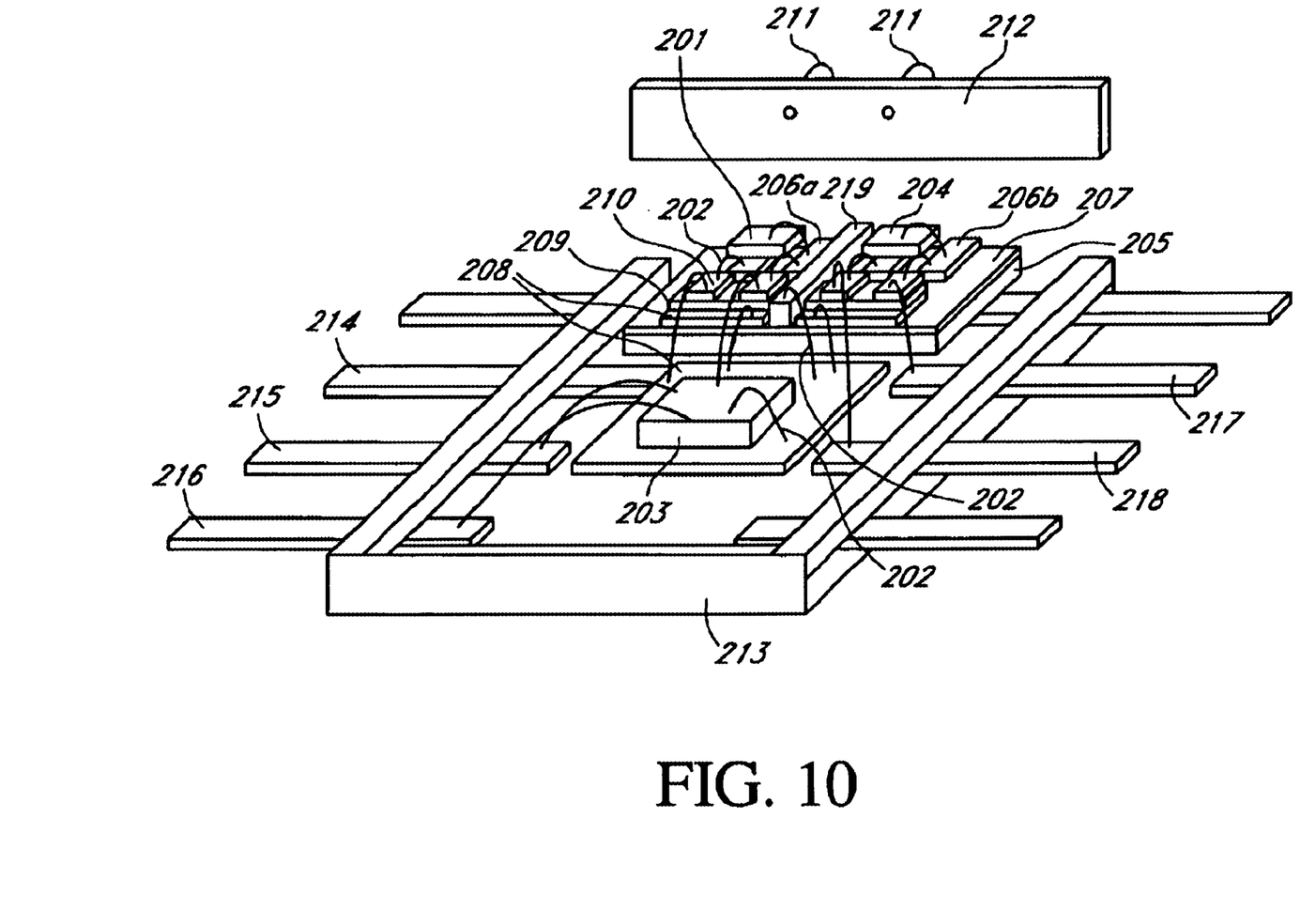
FIG. 10 is an illustration of a first detailed example of the invention.

FIG. 10 is a schematic view showing a first concrete example of the optical module of the invention. The reference numeral 205 denotes an Si substrate having a thickness of 1 mm, a specific resistance of 2000 Ωcm, and a size of 3×3 mm on which the photodetector 201 and the light emitting device 204 are mounted.

In FIG. 10, $Sio_2$ insulation film 207 on the surface of the Si substrate 205 is formed by means of the thermal oxidation method, copper or gold inter connection patterns 206a and 206b on the $SiO_2$ insulation film 207 are formed by deposition and the generally known lift-off method using photolithography. The light emitting device 201 and photodetector 204 are positioned by using these inter connection patterns 206a and 206b as alignment marks, and fixed by soldering.

Conductor wall 219 is installed between the light emitting device 201 and the photodetector 204 for the purpose of the suppression of electric crosstalk. The conductor wall 219 is formed of a copper plate cut-out so as to have a thickness of 0.15 mm and a size of 1.5×5 mm, which is fixed on the Si substrate 205 by using an epoxy adhesive. Herein, a conductor wall having an I-shaped section is employed as the conductor wall 219.

The photodetector 201 and conductor pattern 206a for removing the photocurrent from the photodetector 201; and the light emitting device 204 and conductor pattern 206b for driving the light emitting device 204 are divided and disposed at both sides of the conductor wall 219 so as to sandwich the conductor wall 219 between them. In one implementation, the same V-groove as that of FIG. 2 is formed in the Si substrate 205 for the purpose of alignment with and connection to external optical fibers. Also, in the same manner as that of the module shown in FIG. 2, a photodetector (MPD in FIG. 2) for detecting the output of the light emitting device 204 and feedback-control is mounted at the rear stage of the light emitting device 204, however, its illustration is omitted for convenience.

As the light emitting device 204, a generally-known edge emission type light emitting device is employed, which has a resonator formed of an InGaAsP active layer with a double hetero structure on an InP substrate, and has an oscillation wavelength of 1.31 μm and a threshold current of 5 mA. As the photodetector 201, an edge illumination type photodetector is employed, which has an InGaAsP waveguide type light absorbing layer on an InP substrate, and has a photosensitivity of 0.8 A/W.

To make optical coupling easier, both devices 201 and 204 are installed at the end part of the Si substrate 205 so that the light emission direction and light incidence direction of both devices 201 and 204 are coupled with those of the optical fibers 211 as shown in FIG. 10.

In the figure, lead frame 213 is a part of the external form of the optical module, which is provided with, in addition to the Si substrate 205 with the photodetector 201 the light emitting device 204 mounted on it, bias and output terminals 215 and 216 for taking-out a detected current from the photodetector 201, positive and negative terminals 217 and 218 for supplying a drive current to the light emitting device 204, and earthing terminal 214. Furthermore, optical ferrule 212 for connection to the optical fibers 211 is attached.

On the lead frame 213, preamplifier 203 is attached which amplifies a detection signal from the photodetector 201 and transmits the signal to the outside of the optical module, and components and inter connection patterns on the Si substrate 205, or terminals and preamplifier 203, on the lead frame 213 are connected by bonding wires 202 as necessary.

The materials and forms of the lead frame and the terminals or the optical ferrule are designed upon taking the strength, reliability, and convenience for connection to external parts of the optical module into consideration. However, these are not provided as indispensable conditions of the invention, so that detailed description thereof is omitted.

Furthermore, in the present example, the conductor wall 219 provided on the Si substrate 205 is connected to the earthing terminal 214 via the bonding wire 202.

CONCRETE EXAMPLE 2

Figure 11:
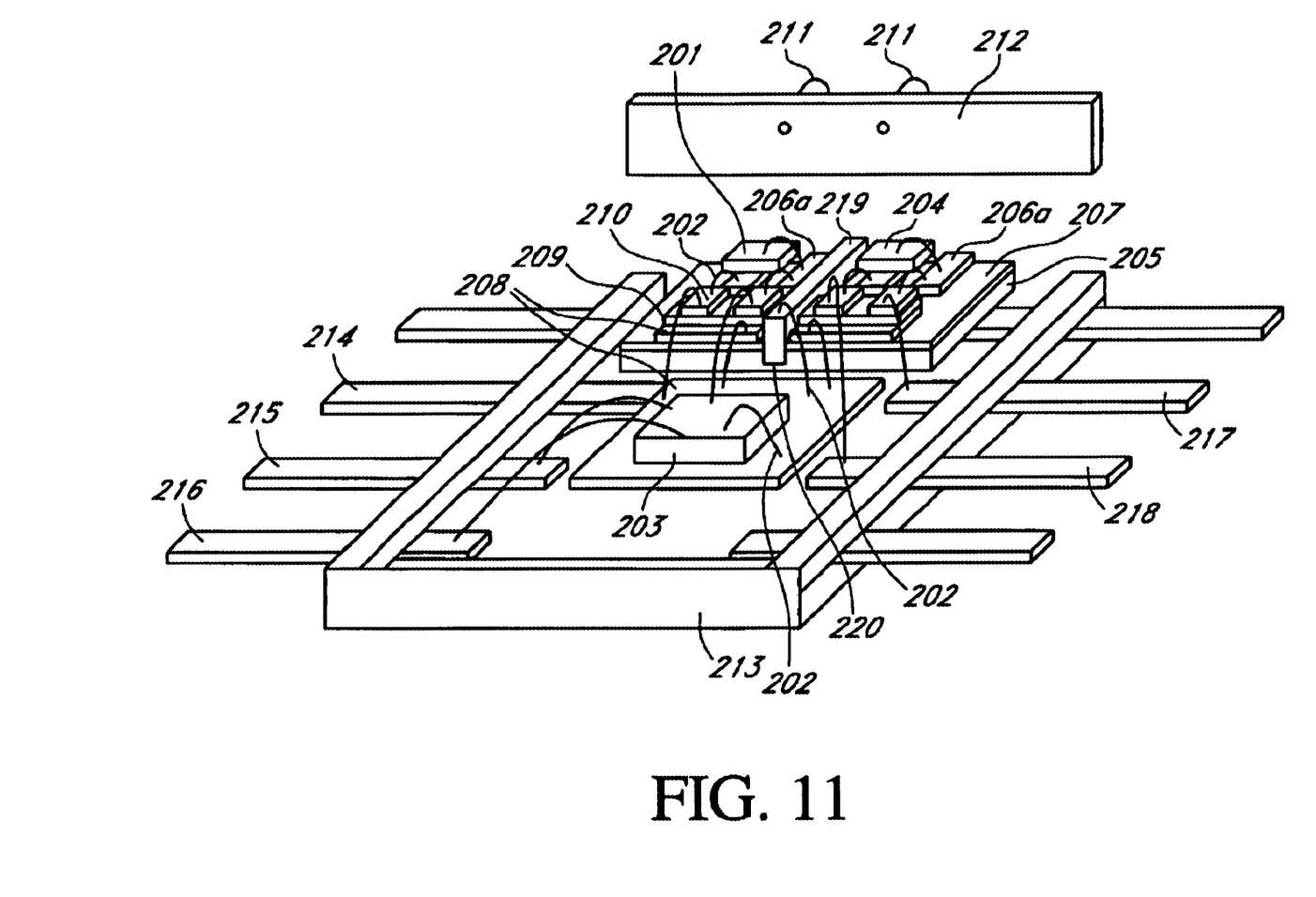
FIG. 11 is an illustration of a second detailed example of the invention.

FIG. 11 is an explanatory view showing a second concrete example of the invention. The second concrete example of the invention is different from the first concrete example in that a part of the conductor wall 219 is installed in a manner such that it fits into groove 220 formed in the Si substrate 205. The groove 220 in the second concrete example is formed by etching after forming the $SiO_2$ insulation film 207, and is formed to have a width of 0.20 mm and a depth of 0.5 mm across the entire length of the Si substrate .205.

A copper plate with a thickness 0.15 mm and a size of 2×5 mm is used for the conductor wall 219, and the conductor wall 219 is installed so as to be 1.5 mm higher than the surface of the Si substrate 205 as in concrete example 1.

Figure 12:
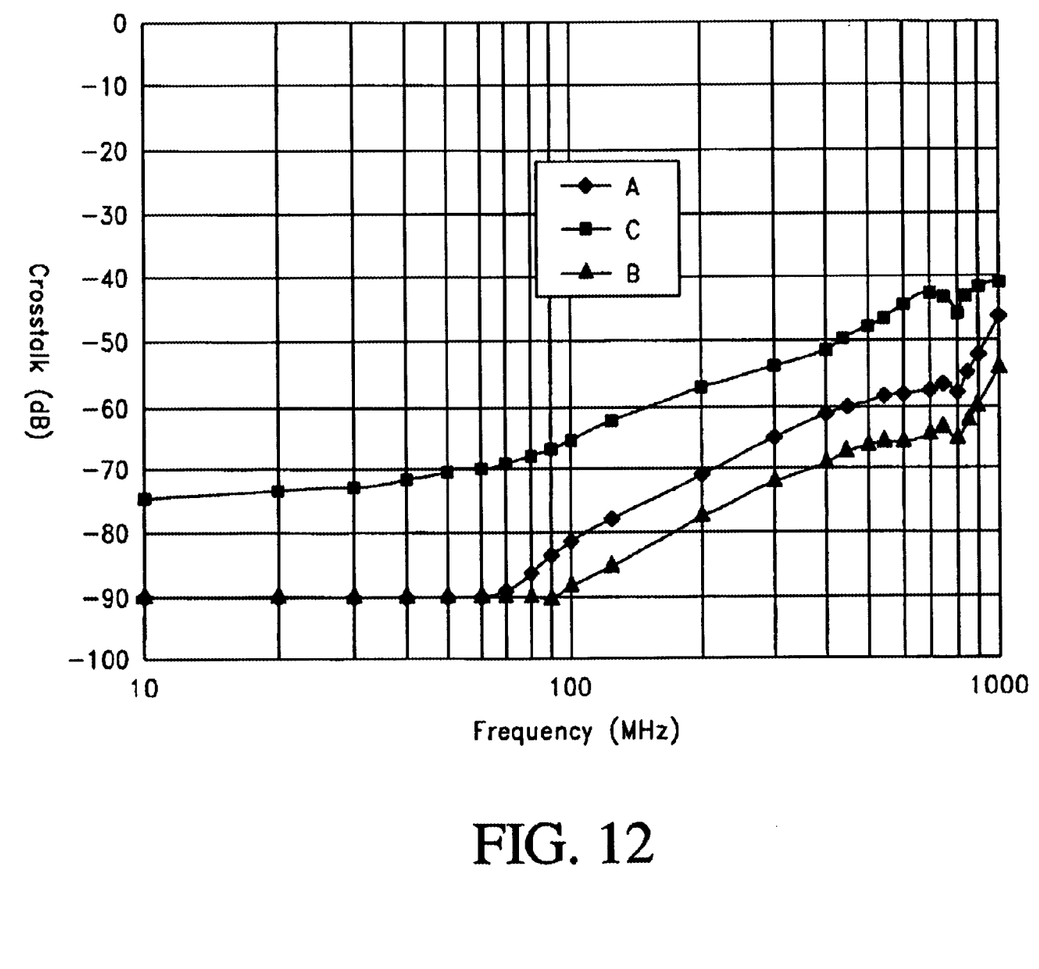
FIG. 12 is an illustration of the results of experiments showing the effect of the invention.

For confirmation of the effect of the invention, the results of comparative measurements are shown in FIG. 12. In the figure, A corresponds to the amount of crosstalk in the optical module of concrete example 1, and B corresponds to the amount of crosstalk in the optical module of concrete example 2. Also, C corresponds to the results of measurements of the amount of crosstalk in a condition where the conductor wall 219 and the bonding wire 202, which connected the conductor wall to the earthing terminal 214, have been removed from the optical module of concrete example 1.

From FIG. 12, it can be understood that a remarkable effect in the reduction in crosstalk is obtained by the conductor wall 219 of the invention. It also can be understood that the groove 220 is formed to be fitted with the conductor wall 219 of the invention, and the conductor wall 219 is arranged and fitted into the groove 220, whereby an effect of a further reduction in crosstalk is achieved.

CONCRETE EXAMPLE 3

Figure 13:
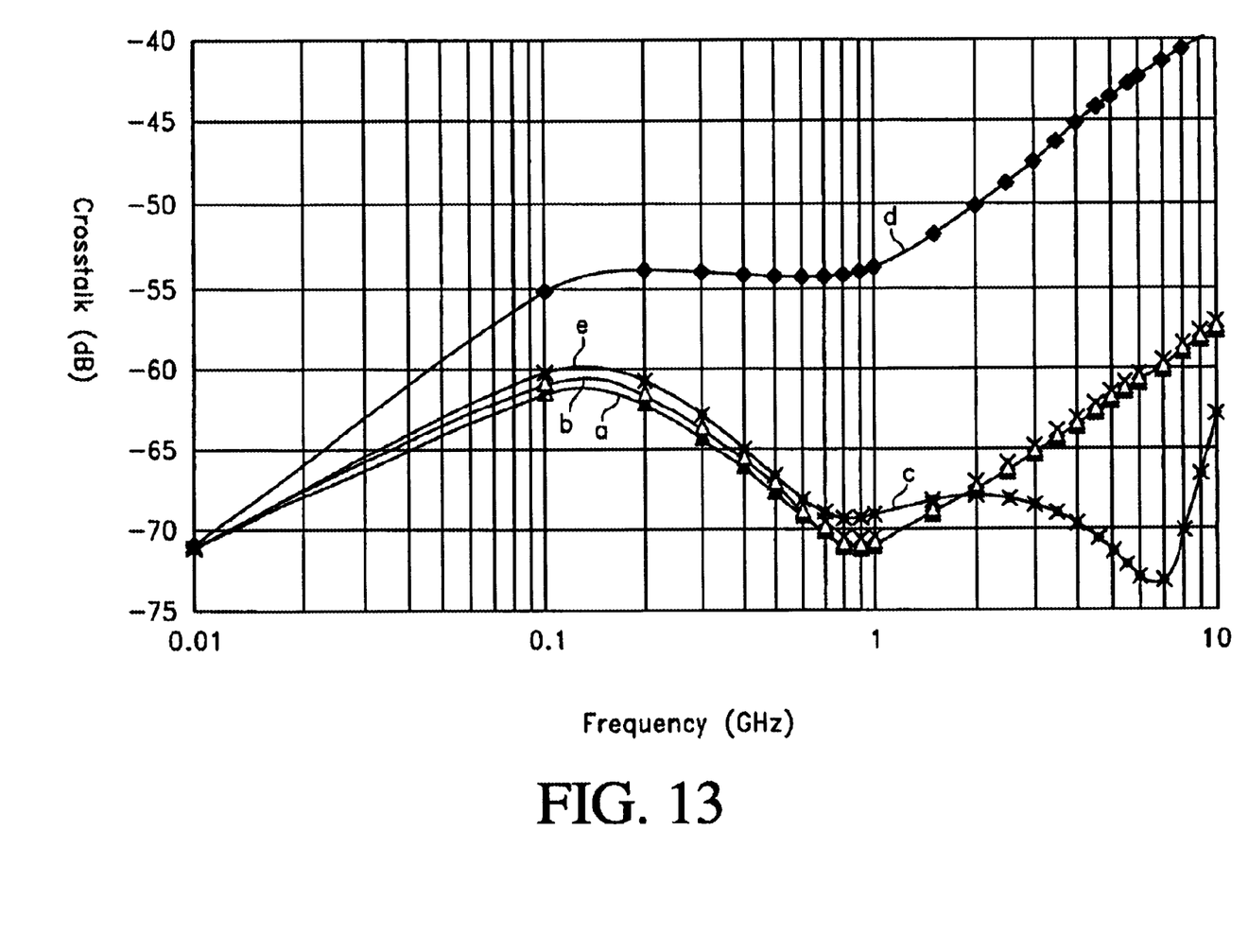
FIG. 13 is an explanatory view of the results of simulations showing the effect of the invention.

In the respective optical modules shown in FIG. 4(a) (I-shaped conductor wall), FIG. 9(a) (T-shaped conductor wall), FIG. 9(b) (L-shaped conductor wall), and FIG. 9(c) (L- and bar-shaped conductor wall), the results of simulation of the relationships between the signal frequencies and the amounts of crosstalk are shown in FIG. 13. The characteristic lines a, b, and c of FIG. 13 show the characteristics of the respective optical modules of FIG. 9(a), FIG. 9(b), and FIG. 9(c).

With regard to the optical module shown in FIG. 4(a), the result of simulation in the case where the width of the conductor wall 219 (the width in the direction connecting the light emitting device 204 and the photodetector 201) is 200 µm is shown by the characteristic line d of FIG. 13, and the result of simulation in the case where the width of the conductor wall 219 is 350 µm is shown by the characteristic line e of the same figure.

From the results, in the optical module shown in FIG. 4(a), although the amount of crosstalk is small even in the case where the width of the conductor wall 219 is set to 200 µm, the amount of crosstalk in the case where the width is set to 350 µm is still less than in the above case. Thus, an increase in width of the conductor wall 219 is an effective means for suppressing crosstalk. From this point of view, it is preferable that the width of the conductor wall 219 is set to 300 µm or more.

Furthermore, it can be understood that, even when the width of the conductor wall 219 is not sufficiently large, by employing the structures shown in FIGS. 9(a), (b), and (c), an electromagnetic shield effect can be obtained that is equivalent to or more than the case where the width of the conductor wall 219 is large.

Particularly, in the optical module shown in FIG. 9(c), the obtained electromagnetic shield effect at a higher frequency is greater than that of the other cases.

Figure 14A:
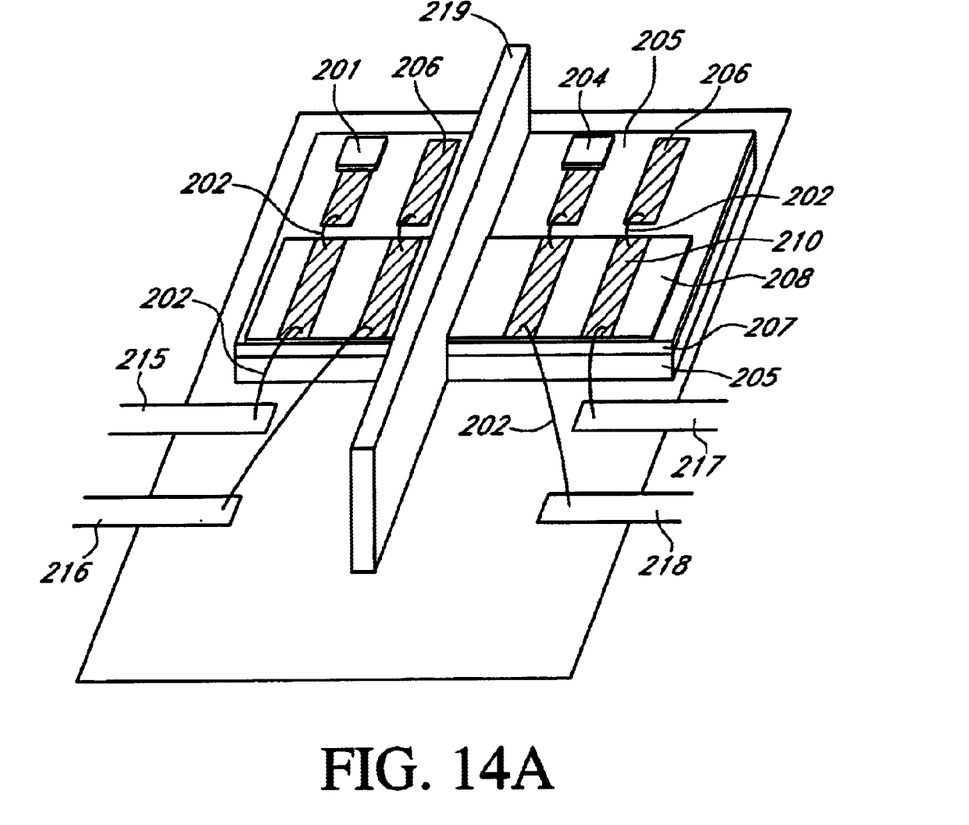
FIG. 14(a) is a perspective view.
Figure 14B:
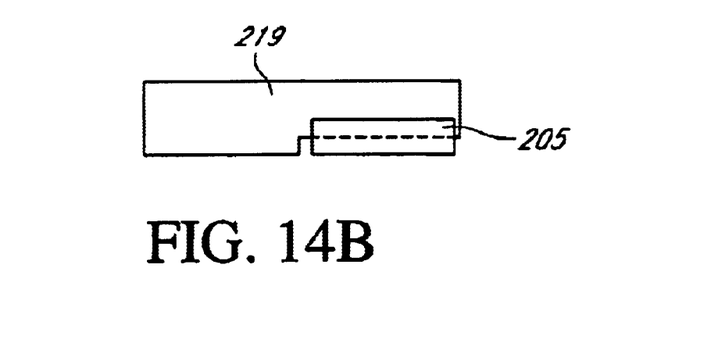
FIG. 14(b) is a partial enlarged side view.

The invention is not limited to the abovementioned embodiments and examples. For example, the conductor wall 219 is provided only for division on the Si substrate in the abovementioned embodiments and examples, however, a more preferable embodiment is shown in FIGS. 14(a) and (b) in which the conductor wall 219 is extended so as to also divide the wires and terminals to be connected to the Si substrate 205 between the photodetector side and the light emitting device side.

For example, the optical module comprising an end face incidence type photodetector and an end face emission type light emitting device mounted on the Si substrate is described above. However, the invention is applicable to an optical module using a surface light emitting device and a surface photodetector, wherein the same crosstalk reduction effect can be obtained.

In addition, in the present specification, for simplicity of description, an optical module having one photodetector and one light emitting device mounted on an Si substrate is mainly described. However, the invention is applicable to an optical module having a plurality of photodetectors and a plurality of light emitting devices mounted on an Si substrate. In this case, as the construction of the invention, it is required that at least one conductor wall is provided between the photodetectors and the light emitting devices.

Furthermore, in the present specification, an optical module in which the optical devices are directly connected to optical fibers is mainly described. However, the invention is applicable to various optical modules, such as an optical module in which planar waveguides (PLC) are mounted on an substrate as well as a photodetector and a light emitting device, and the devices are connected to optical fibers via the waveguides.

INDUSTRIAL APPLICABILITY

As described above, the optical module of the invention is a module having a photodetector and a light emitting device on a substrate, which is suitable for optical transmission since high quality signal processing can be performed by suppressing the influence of crosstalk on the photodetector from the light emitting device side and detecting an extremely small photocurrent of the photodetector in the module.

What is claimed is:
1. An optical module comprising:
   a substrate with a photodetector and a light emitting device mounted on the substrate; and
   at least a dielectric layer formed between said photodetector and the substrate, and further formed between said light emitting device and the substrate, wherein a conductor wall is provided between the photodetector and the light emitting device such that electrical interference between the light emitting device and the photodetector is reduced.
2. An optical module as set forth in claim 1, wherein the conductor wall is fitted and fixed into a groove formed in the substrate.
3. An optical module as set forth in claim 1 or 2, wherein the conductor wall is provided with a top plate positioned above one or both of the photodetector and the light emitting device.
4. An optical module as set forth in claim 3, wherein the conductor wall is formed so as to have a T-shaped section.
5. An optical module as set forth in claim 3, wherein the conductor wall is formed so as to have an L-shaped section.
6. An optical module as set forth in claim 3, wherein the conductor wall is composed of a first portion formed so as to have an L-shaped section and a second portion which forms a top plate with a bar-shaped section and is provided independently from said first portion.
7. An optical module as set-forth in claim 3, wherein the conductor wall is formed by arranging two portions with L-shaped sections back to back with each other.
8. An optical module as set forth in claim 1, wherein the conductor wall is connected to at least one of a ground provided in a drive circuit of the light emitting device and a ground provided in an amplifier circuit for electric signals outputted from the photodetector.
9. An optical module as set forth in claim 2, wherein the conductor wall is connected to at least one of a ground provided in a drive circuit of the light emitting device and a ground provided in an amplifier circuit for electric signals outputted from the photodetector.
10. An optical module as set forth in claim 3, wherein the conductor wall is connected to at least one of a ground provided in a drive circuit of the light emitting device and a ground provided in an amplifier circuit for electric signals outputted from the photodetector.
11. An optical module as set forth in claim 8, wherein the conductor wall is formed of a plurality of portions which are provided independently and separately from each other, and grounds of the respective portions of the conductor wall are separately provided.
12. An optical module as set forth in claim 9, wherein the conductor wall is formed of a plurality of portions which are provided independently and separately from each other, and grounds of the respective conductor portions are separately provided.
13. An optical module as set forth in claim 10, wherein the conductor wall is formed of a plurality of portions which are provided independently and separately from each other, and grounds of the respective conductor portions are separately provided.
14. An optical module as set forth in claim 1, wherein the conductor wall is formed by forming a conductive film on the surface of a wall member made of a resin mold.
15. An optical module as set forth in claim 2, wherein the conductor wall is formed by forming a conductive film on the surface of a wall member made of a resin mold.
16. An optical module as set forth in claim 3, wherein the conductor wall is formed by forming a conductive film on the surface of a wall member made of a resin mold.

* * * * *